United States Patent [19]

Niehenke

[11] 4,160,215
[45] Jul. 3, 1979

[54] SINGLE DIODE UPPER SIDEBAND TERMINATED PARAMETRIC AMPLIFIER

[75] Inventor: Edward C. Niehenke, Baltimore, Md.

[73] Assignee: Westinghouse Electric Corp., Pittsburgh, Pa.

[21] Appl. No.: 900,955

[22] Filed: Apr. 28, 1978

[51] Int. Cl.² ............................................. H03F 7/04
[52] U.S. Cl. .................................... 330/4.9; 307/424; 330/4.5
[58] Field of Search ................. 330/4.9, 4.5; 307/88.3

[56] References Cited

U.S. PATENT DOCUMENTS

| 3,517,209 | 6/1970 | Abel ................................ 330/4.9 X |
| 3,518,562 | 6/1970 | Lombardo et al. ................. 330/4.9 |
| 3,609,571 | 9/1971 | Klein et al. ....................... 330/4.9 |
| 3,805,176 | 4/1974 | Kudo et al. ....................... 330/4.9 |
| 3,992,675 | 11/1976 | Niehenke et al. ................. 330/4.9 |

*Primary Examiner*—James B. Mullins
*Assistant Examiner*—Darwin R Hostetter
*Attorney, Agent, or Firm*—Benjamin J. Goldfarb

[57] ABSTRACT

A single varactor diode parametric amplifier is described which has a broadband termination at the upper sideband frequency in the pump waveguide. This termination presents an open circuit condition at the upper sideband frequency, which, in combination with an upper sideband fequency choke on the input signal circuit transmission line achieves low noise, high gain characteristics with minimum interaction with the input signal, pump, and idler circuitry. Theoretical noise figures can be obtained at low power consumption, high gain, and broadband performance.

9 Claims, 6 Drawing Figures

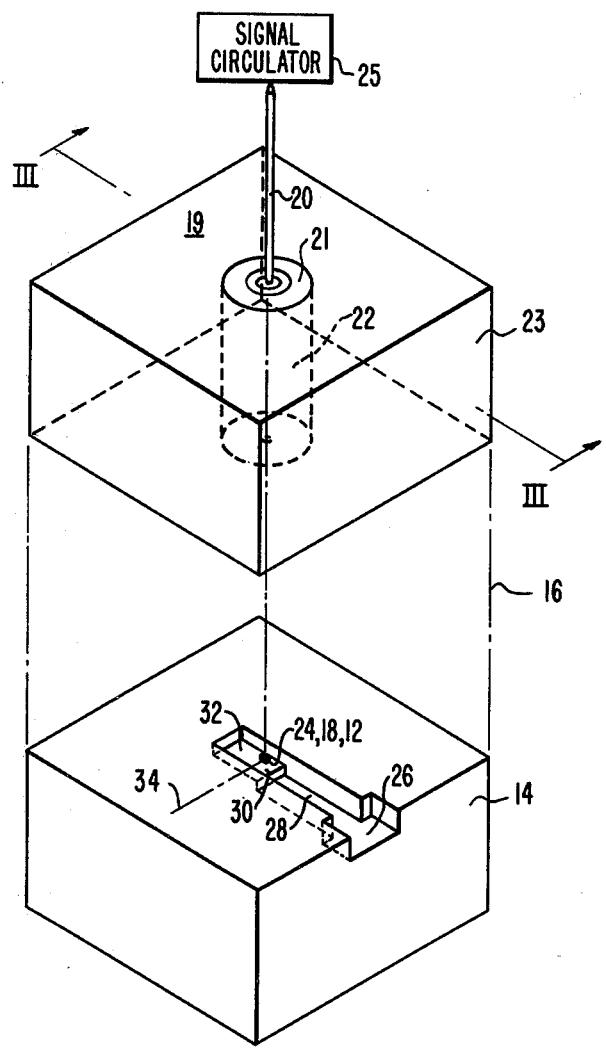
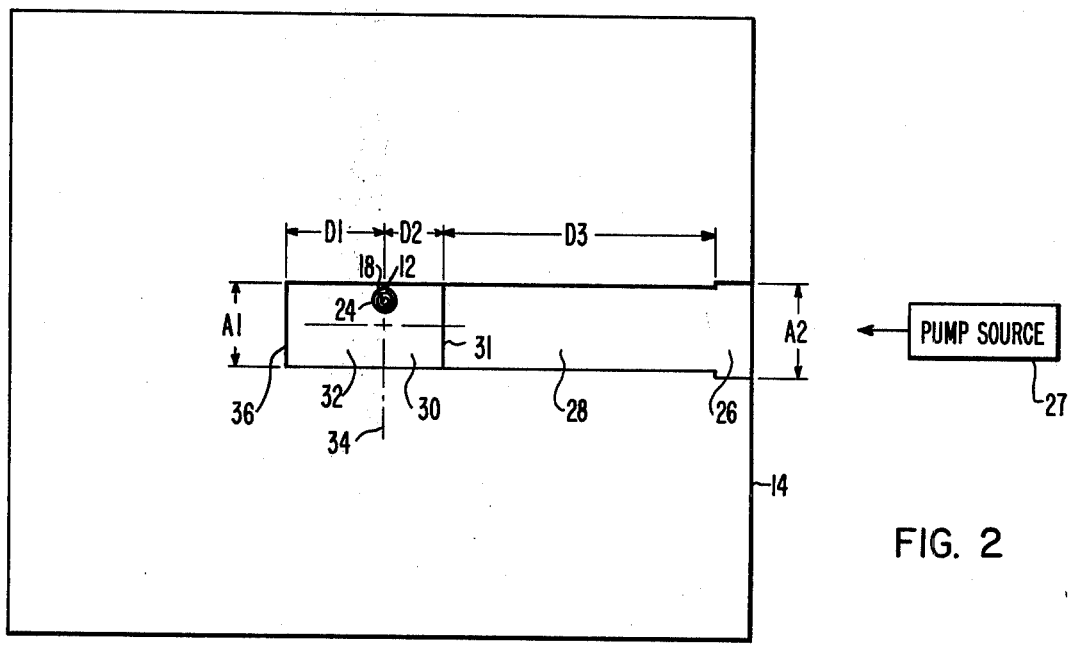

SINGLE DIODE UPPER SIDEBAND TERMINATED PARAMETRIC AMPLIFIER

GOVERNMENT CONTRACT

The invention herein described was made in the course of or under a contract or subcontract thereunder with the Department of the Air Force.

BACKGROUND OF THE INVENTION

1. Field of the Invention

The present invention relates to a parametric amplifier; and, more particularly, to a parametric amplifier having a single varactor diode and a broadband termination of the upper sideband frequency.

2. Description of the Prior Art

Parametric amplification refers to a class of amplifiers where amplification at microwave frequencies has been achieved, wherein the output power is derived from an A.C. input, and derives its name from the fact that the differential equation governing the circuit behavior contains one or more reactive parameters which are non-linear or time varying. Parametric amplifiers can operate on the basis of periodically varying the capacitance of a varactor diode by means of a high frequency pump signal and transferring energy to a lower frequency microwave input signal by mixing of the input frequency with the much higher pump frequency through an idler frequency. The Manley-Rowe relations show that the current must flow at the three frequencies satisfying the relation:

*Pump Frequency = Signal Frequency + Idler Frequency* for gain to exist at the signal frequency.

A parametric amplifier employs one or more varactor diodes and a pump frequency source to obtain gain with extremely low noise figures. The pump frequency source strongly modulates or pumps the capacitance of the varactor diode at the pump frequency rate. Sum (upper sideband) and difference (idle) frequencies are generated due to the nonlinearity of the varactor diodes. The idle frequency circuit is reactively tuned (no resistive loading) for maximum current flow at the idle frequency while the upper sideband frequency circuit is adjusted for zero current flow at that frequency to achieve maximum gain and low noise figure characteristics.

Obtaining operation with efficient pump coupling to the varactor diode and minimal interaction between the upper sideband, idle, signal, and pump frequencies has been difficult to achieve in previous types of parametric amplifiers which generally have uncontrolled frequency terminations. Consequently, complex multiple tuning designs have been required to manually tune each parametric amplifier but, in general, these tuning designs do not result in optimum broadband performance. For example, one such attempt to control the upper sideband frequency impedance for a balanced diode amplifier is described in U.S. Pat. No. 3,609,571, issued Sept. 28, 1971, "Sideband Suppression for Broadband Parametric Amplifier", Klein et al. With this arrangement, tuning screws were required which did not provide truly independent adjustment of the pump and the upper sideband frequencies causing the parametric amplifier adjustments to be extremely critical with resulting high production costs and high pump power.

U.S. Pat. No. 3,992,675, issued Nov. 16, 1976, Niehenke and Linsenbardt, provides a parametric amplifier having a balanced varactor diode arrangement to parametrically couple the pump and input signals and a resonating waveguide with upper and lower choke waveguide combined with a terminating waveguide. The upper sideband signal current is inhibited by having the terminating waveguide present a reactance to the diodes that is the conjugate of the reactance presented by the upper and lower choke waveguide resulting in an open-circuit termination at the upper sideband frequency.

U.S. Pat. No. 3,518,562, issued June 30, 1970, Lombardo et al., provides a parametric amplifier with a single varactor diode and an adjustable filter device in the signal transmission line. U.S. Pat. No. 3,805,176, issued Apr. 16, 1974, Tatsuo Kudo, et al., provides a single varactor diode parametric amplifier with a choke filter to choke the pump frequency power and another choke filter to choke the idler frequency power, both chokes being in the signal transmission line. No provision is made for inhibition of the upper sideband signal frequency in the input signal transmission line.

It is therefore desirable to provide a parametric amplifier having a single varactor diode with a low noise figure, high gain, and low power consumption.

It is therefore desirable to provide a parametric amplifier with a single varactor diode and a broadband termination at the upper sideband frequency incorporated in the pump circuit path.

It is also desirable to provide a parametric amplifier with single varactor diode and an upper sideband frequency choke incorporated in the signal circuit path to prevent the upper sideband frequency signals from going to the signal output.

SUMMARY OF THE INVENTION

The invention is a parametric amplifier of the single varactor diode type having a waveguide with predetermined dimensions to provide a half-wave waveguide condition at the upper sideband signal frequency to inhibit said frequency and an approximate one-quarter wavelength condition at the pump signal frequency to provide efficient coupling of the said diode to said waveguide at the pump frequency; an input transmission line having an upper sideband signal frequency suppression means to prevent the signal current at said frequency from flowing in said varactor diode; said transmission line having a pump signal frequency suppression means to prevent signal currents at said pump frequency from entering said transmission line; said transmission line having an idler signal frequency suppression means and an associated idler circuit to confine signal currents at said idler frequency to the idler circuit; and said upper sideband signal suppression means, pump signal frequency suppression means, and idler signal frequency suppression means situated on said transmission line at predetermined spacings and distances from said varactor diode to provide minimum interaction of the upper sideband, pump, and idler frequencies with each other or with the input signal frequency. Theoretical noise figures with low pump power drive are realized with this embodiment.

BRIEF DESCRIPTION OF THE DRAWINGS

FIG. 1 is an exploded enlarged isometric fragmentary view of a single varactor parametric amplifier which is the preferred embodiment of the present invention;

FIG. 2 is an enlarged fragmentary plan view of the varactor diode mount waveguide plate to illustrate the location of the varactor diode with respect to the various waveguide sections;

DESCRIPTION OF THE PREFERRED EMBODIMENTS

Figure 3:
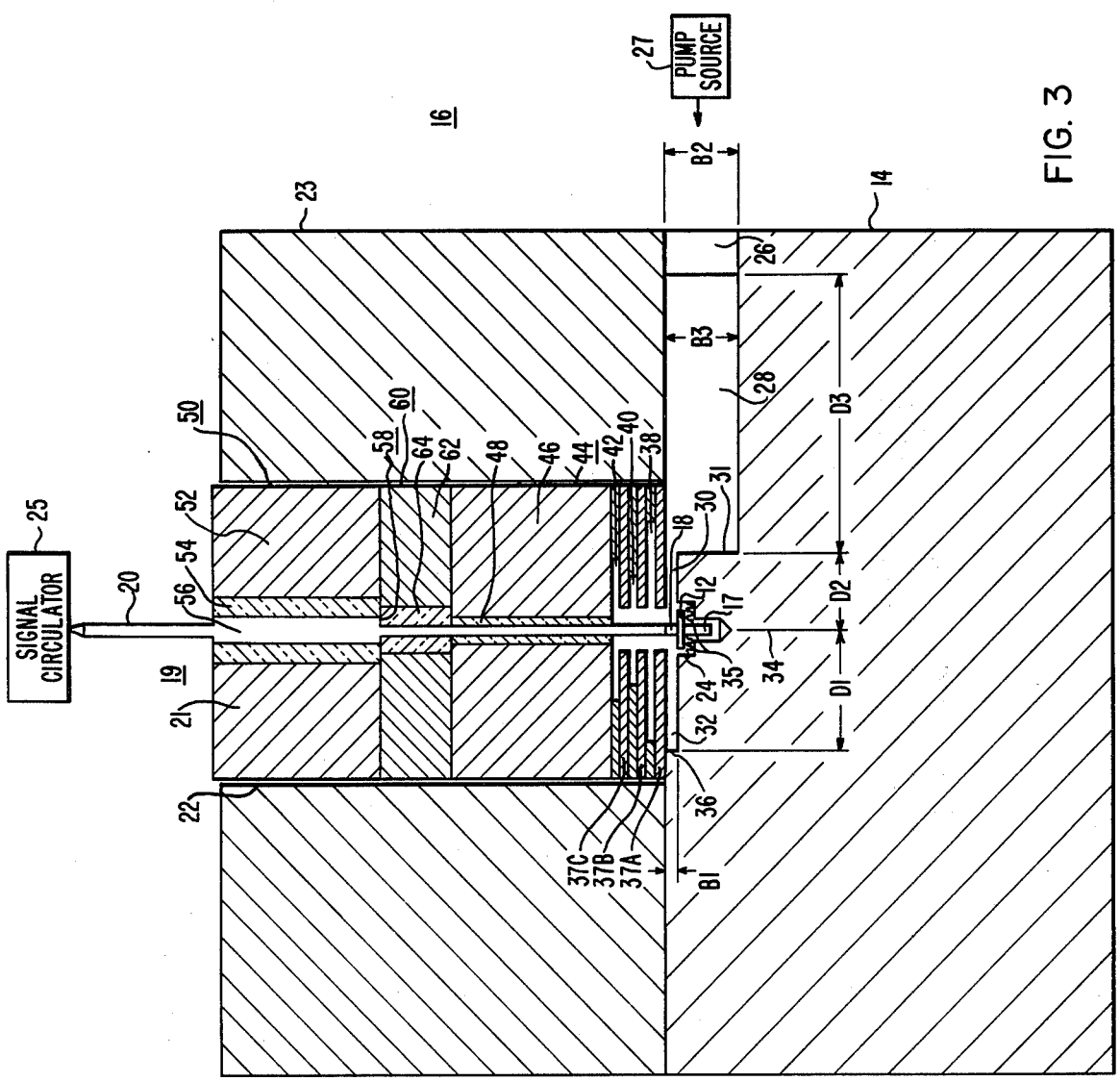
FIG. 3 is an enlarged sectional view taken at line III—III of FIG. 1.

Referring to FIGS. 1, 2 and 3, varactor diode 12 is mounted in the bottom plate or waveguide panel 14 of the parametric amplifier 16. Cathode 18 of diode 12 is connected to a microwave input signal line 20, which may be, for example, the center conductor of a coaxial transmission line 19 having an outside conductor shell 21, to a signal circulator 25. Input signals are conducted by line 20 from the circulator 25 passing through transmission line 19 and cavity 22 in the upper plate 23 of the parametric amplifier 16 to diode 12 to be amplified and the amplified signals are conducted back by line 20 from diode 12 to the circulator 25. The anode 17 of diode 12 is coupled to plate 14 by spring 35.

Signal circuit impedance transformation and the prevention of the upper sideband, idler and pump signal frequencies from entering the signal circulator 25 will be described hereinafter. Pump signals are propagated successively from the pump source 27 to pump waveguide 26, waveguide 28, waveguide 30, and terminating waveguide 32. Varactor diode 12 is mounted in a well 24 centered at the junction 34 of waveguides 30 and 32 at a distance D1 from the back shorting wall 36 of waveguide 32. The interaction of the pump signals with the signal inputs at the varactor diode parametrically generate upper sideband and idler signal frequencies. D1 is one-half wavelength for optimum performance at the upper sideband signal frequency and could be in the range of 0.45 to 0.55 wavelength and at approximately one-quarter wavelength for optimum performance at the pump signal frequency and could be in the range of 0.2 to 0.3 wavelength. The half-wave condition will function to inhibit the upper sideband signals from entering waveguides 30, 28, and 26. Inhibition of the upper sideband signal from entering the pump source 27 and circulator 25 contributes to the amplification of the input signal since maximum gain will be obtained if there is a minimum current flow in the diode circuit at the upper sideband frequency.

Reference is made to U.S. Pat. No. 3,992,675 issued Nov. 16, 1976 entitled "Broadband, Upper Sideband Terminated, Low-Noise Parametric Amplifier" to E. C. Niehenke and A. E. Linsenbardt wherein equation (1) describes the noise figure behavior for arbitrary termination at the upper sideband frequency and equation (3) describes the impedance for arbitrary terminations at the upper sideband frequency. Equation (1) in the present patent in simplified form describes the noise figure behavior for arbitrary terminations at the upper sideband frequency and was used for the calculations in FIG. 4. The approximately one-quarter wavelength condition functions to provide good coupling of the pump signal to the varactor diode 12. The width A1 of the terminating waveguide 32 is selected to provide for waveguide 32 to have a frequency cut off between the idler frequency and the pump frequency so that waveguide 32 will not sustain a signal at the idler frequency in the vicinity of diode 12 and to confine the idler signal to diode 12. Length D2 of waveguide 30 is substantially less than length D1 of waveguide 32 to locate diode 12 substantially closer to the junction or step 31 than it is to the shorting wall 36 so that the impedance of diode 12 is at a voltage maximum at the step 31. The idler signal frequency in waveguides 32, 30, and 28 is cut off by predetermined selection of dimensions A1, D2, and D3 thus decoupling the idler signal in diode 12 from the pump waveguide 26. In this embodiment length D3 of waveguide 28 is equal for optimum performance to one-half the wavelength of the pump signal frequency to provide for optimum coupling of the pump signal to waveguide 30 and diode 12; the physical length of D3 depends on the diode utilized and the pump frequency.

To obtain low insertion loss at the diode 12 with respect to the pump signal and to provide for amplification with substantially low pump power for example 40 milliwatts with a 0.2 pf diode back biased at 4.5 volts, the impedance of diode 12, approximately 3–5 ohms at the pump signal frequency, is increased substantially to match the impedance of diode 12 to the impedance of waveguide 28, approximately 400 ohms at the pump signal frequency, by the transverse and longitudinal position of diode 12. The well 24 is located as close as possible to one side of waveguide 32 and the junction 34 of waveguides 30 and 32 is located close to step 31. Height B3 and length D3 are selected to finally match, in a one-step transformation at step 31, the impedance of the pump source to the impedance of diode 12 by predetermined ratio of height B2 with respect to height B1.

In the preferred embodiment, one example of the dimensions for optimum performance of the waveguides as set out in FIGS. 2 and 3 are as follows:

| A1 - 0.126″ | B1 - 0.018″ |
| A2 - 0.148″ | B2 - 0.074″ |
| D1 - 0.138″ | B3 - 0.074″ |
| D2 - 0.079″ | |
| D3 - 0.281″ | |

For the above dimensions, the pump frequency is 51.5 GHz and the signal frequency is approximately 10 GHz. The length of waveguide 26 is approximately 0.8″ in length. Diode 12, for example, has a 0.2 pf zero bias junction in a microwave min dot diode package outline 290-001 manufactured by Alpha Industries, Woburn, Mass. 01801.

Referring to FIG. 3, the line 20 is in mechanical pressure contact with cathode 18 of varactor diode 12 which is resiliently supported by spring 35 in contact with anode 17 and plate 14 in well 24. The contact between the line 20 and cathode 18 is made by the pressure of the line 20 against the cathode 18 when the circulator is connected to line 20. This pressure is mechanically counterbalanced by the resiliency of spring 35.

Suppression of the pump, upper sideband, and idler signal frequencies to prevent these signals from entering the signal circulator 25 is necessary to obtain a low noise amplified output signal. Accordingly, electrically conducting cylindrical chokes of uniform outside diameters but of predetermined inside diameters are positioned on line 20 within cavity 22 and are separated by electrically conducting spacers 37A, 37B, and 37C. The chokes and spacers are in the following sequence: spacer 37A which is in contact with waveguide plate 14 preceeds idler choke 38, spacer 37B, upper sideband choke 40, spacer 37C, and pump choke 42. The adjacent chokes and spacers are in electrical contact with each other but are not in physical or electrical contact with line 20. The position of the idler choke 38 is selected to resonate the diode 12 at the idler frequency by utilizing the section of the line 20 between choke 38 and diode 12 to transform the essentially open circuit reactance of the choke 38 to a reactance which is conjugate to the reactance of the diode 12 at the idler frequency thereby confining the idler energy to that relatively short section of line 20.

Suppression of the reactive loading with choke 38 function to minimize the dissipative loading on diode 12 except for the internal loading of the diode itself while at the same time the idler current and gain of diode 12 is maximized. The idler and pump chokes are disclosed in the prior art.

Choke 40 is employed to prevent the upper sideband signal frequency from entering the circulator 25. The position of choke 40 is selected so that no current flows in diode 12 at the upper sideband signal frequency. The section of line 20 between choke 40 and diode 12 is utilized to transform the essentially open circuit reactance of choke 40 to an inductive reactance which, when combined with the inductive reactance of terminating waveguide 32, is the conjugate of the diode 12 case capacitive reactance represented as capacitor 76 in FIGS. 5 and 6 at the upper sideband frequency. The net effect is that diode case capacitance 76 in FIG. 6 is parallel resonated with the choke 40 circuit and the inductance 82 to suppress any current flow in diode 12 at the upper sideband frequency.

The position of the pump choke 42 is selected so that the section of line 20 between choke 42 and diode 12 is approximately one-quarter wavelength at the pump signal frequency to short circuit the pump signal at diode 12 and prevent the pump signal from entering the circulator.

In the preferred embodiment, the dimensions of the respective choke components for optimum performance of the signal circuit are as follows:

|  | Inside Diameter | Thickness |
|---|---|---|
| Pump choke 42 | 0.210" | 0.020" |
| Spacer 37C | 0.035" | 0.015" |
| Upper Sideband choke 40 | 0.186" | 0.020" |
| Spacer 37B | 0.035" | 0.008" |
| Idler Choke 38 | 0.246" | 0.020" |
| Spacer 37C | 0.035" | 0.020" |

Impedance transformer 44 provides a low characteristic impedance at one-quarter wavelength at the input signal frequency. Transformer 44 may be constructed, for example, as an electrically conducting metal cylinder 46 with a dielectric cylindrical insert 48 through which line 20 passes, and positioned in electrical and physical contact with pump choke 42. Coaxial conductor 50 is comprised of an electrically conducting metal cylinder 52 with a dielectric cylindrical insert 54 through which line section 56 of line 20 passes. Line section 56 is of greater cross-sectional area than line 20 in order to provide a mechanical bearing surface 58 against a capturing coaxial conductor 60 which may be constructed, for example, as an electrically conducting metal cylinder 62 with a dielectric cylindrical insert 64 through which line 20 passes. The impedance of coaxial conductors 50 and 60 is 50 ohms at the input signal frequency. Electrical contact between the line 20 and the cathode 18 and between waveguide panel 14 and spacer 37A is obtained by pressure applied to bearing surface 58 against coaxial section 60 by line section 56 when the circulator is connected to upper panel 23.

Figure 4:
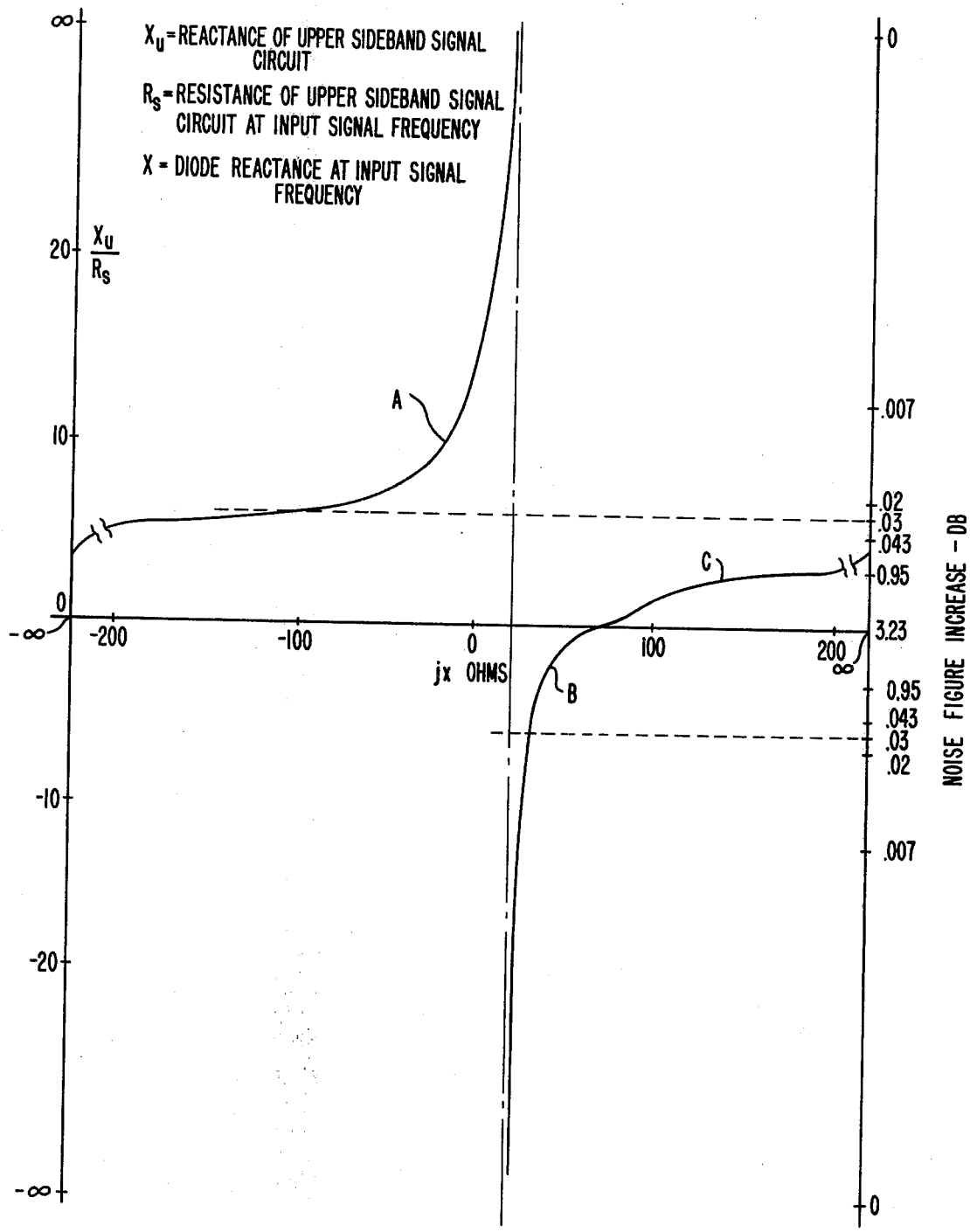
FIG. 4 is a graphical illustration of the operation of the embodiment of the parametric amplifier of the present invention.

Tests have shown that a parametric amplifier utilizing the upper sideband signal termination in the pump waveguide and the upper sideband signal choke in the input signal line together with the idler signal and pump signal terminations and chokes as described in the present invention can achieve high gain with calculated low noise figures. FIG. 4 illustrates the calculated noise figure increase as a function of the reactance presented to the diode for a specific X-band parametric amplifier pumped at 51.5 GHz. The right hand ordinate scale of FIG. 4 represents decibels and the left hand ordinate scale represents the ratio of the reactance as seen by upper sideband signal source 80 of the upper side band signal circuit to the resistance 70 of this circuit at the input signal frequency; the abscissa represents the load reactance 78. As seen from this figure, the noise figure increase can be as much as 3.23 dB; however, a large range does indeed exist for less than 0.03 dB increase of noise signal for an amplifier with a nominal 1.5 dB noise figure. As shown in FIG. 4, the reactance across the diode can be varied from +J30 to −J80 ohms while maintaining a noise figure increase of below 0.03 dB. Several X-Band amplifiers were built with a 51.5 GHz pump using the present invention with consistent noise figures of 1.57 to 1.70 dB with the amplifier stabilized at +60° C. The circulator loss was 0.3 dB. The low pump power required for each of these amplifiers was approximately 40 mw. The pump port match was typically 1.5:1. The amplifier could be tuned in frequency with bias voltage and pump power with no essential change in noise figure or points of gain, loss, or reduction in the tuning which demonstrates the broadband capability of the present invention.

Figure 5:
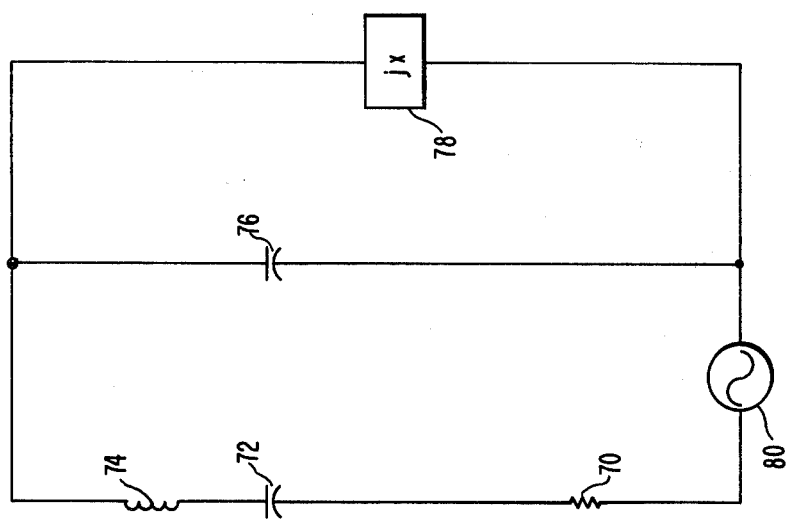
FIG. 5 is an electrical circuit employed in determining the noise figure for various reactive loads shown in FIG. 4 of the preferred embodiment.
Figure 6:
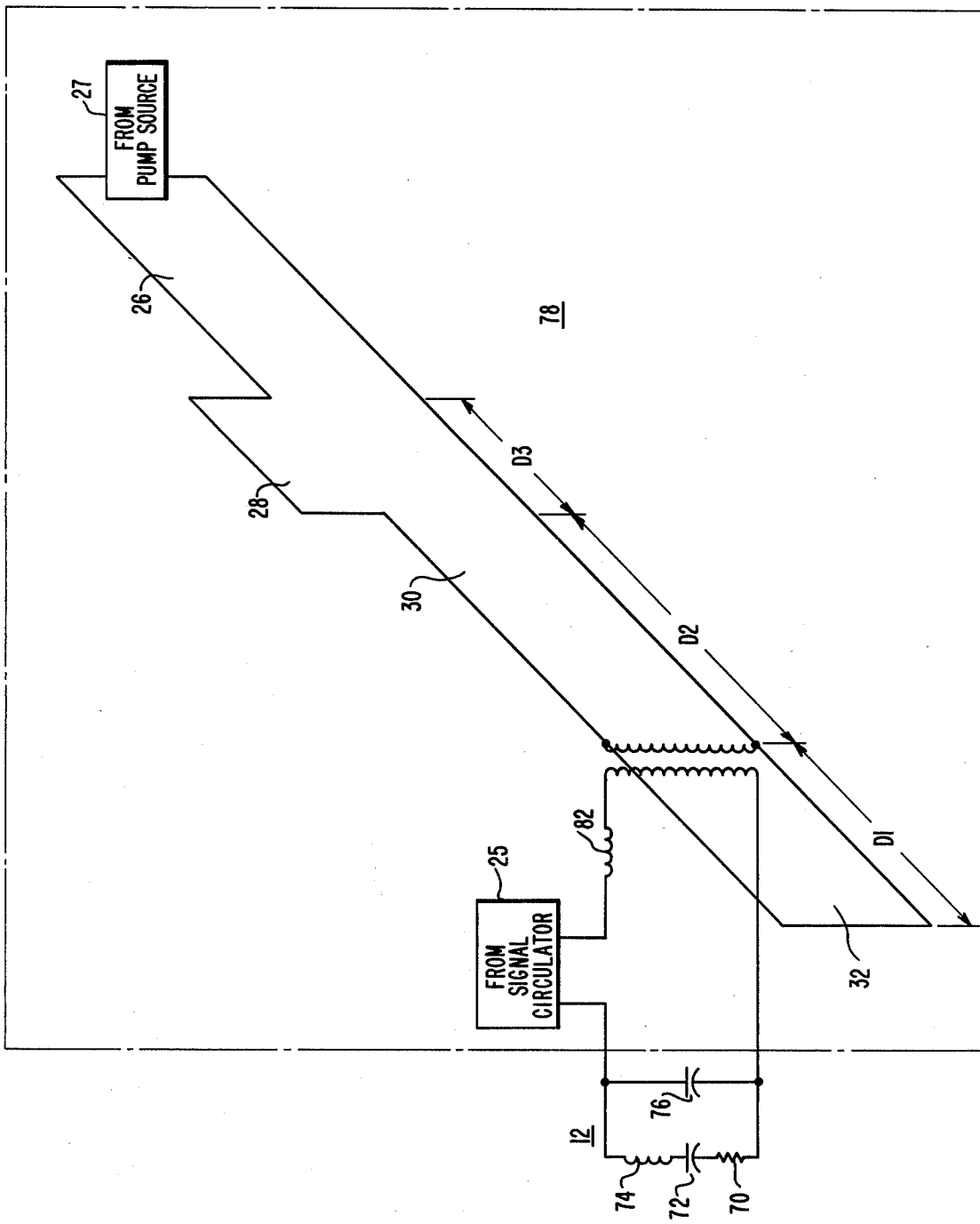
FIG. 6 is an electrical circuit of the preferred embodiment.

FIG. 5 illustrates the electrical circuit employed to measure the noise figure of the preferred embodiment of the single varactor diode parametric amplifier. The circuit includes the resistor 70 which represents the diode loss resistance of 2.2 ohms at the signal frequency; the diode variable capacitance 72 of 0.17pf; the diode package lead inductance 74 of 0.12nh; and the diode stray case capacitance 76 of 0.12 pf. The stray capacitance across the junction is not shown since its effect is negligible. The reactive load 78 has the value of jx which is shown as the abscissa of FIG. 4. The signal source 80 generated signals at a frequency of 61.5 GHz; the signal frequency was within the X-band microwave electromagnetic spectrum. The characteristic noise figure curve of FIG. 4 was based on equation (1):

$$F = 1 + \frac{T_d}{T_o} \cdot \frac{\omega_s}{\omega_i} \cdot \frac{1 + \left(\frac{\omega_i}{M_1 \omega_c}\right)^2 + \left(\frac{\omega_i}{\omega_u}\right)^2 \gamma_u^2}{1 - \frac{\omega_s \omega_i}{(M_1 \omega_c)^2} - \frac{\omega_i}{\omega_u} \gamma_u^2} \quad (1)$$

$$\text{where } \gamma_u^2 = \cfrac{1}{\cfrac{R_u}{R_s}\left(1 + \left|\cfrac{X_u}{R_u}\right|\right)^2}$$

Td = diode ambient temperature
To = 290° K.
$\omega_s$ = signal angular frequency
$\omega_i$ = idler angular frequency
$\omega_u$ = upper sideband angular frequency
$X_u$ = reactance of upper sideband circuit at upper sideband frequency
$R_u$ = resistance of upper sideband circuit at upper sideband frequency
$R_s$ = diode loss resistance at the input signal frequency
$M_1\omega_c$ = angular pumped cutoff frequency
F = noise figure The equivalent circuit of the single varactor diode parametric amplifier shows the diode 12 equivalent circuit connected to the equivalent waveguide circuit by coupling inductance 82 with impedance transformation N, where N depends on the location of the diode 12 relative to the center line of the waveguide as hereinbefore described.

FIG. 6 shows an equivalent electrical circuit of the preferred embodiment.

This invention is not limited to the specific embodiment shown in the drawings and described in the specifications, but is adaptable to numerous other modifications and changes, without departing from the spirit and scope hereof, to produce a single varactor diode parametric amplifier structure characterized by low signal noise and low pump power input.

What is claimed is:

1. A parametric amplifier comprising:
   a diode,
   an input signal source coupled to said diode for providing an input signal,
   a pump signal source coupled to said diode for providing a pump signal,
   said diode amplifying said input signal through interaction of said input signal and said pump signal and generating thereby an upper sideband signal and an idler signal,
   waveguide means for coupling said pump signal to said diode,
   a terminating waveguide coupled to said waveguide means at the place of coupling said diode to said waveguide means,
   said terminating waveguide having predetermined dimensions to provide a onehalf wavelength operating condition at the upper sideband signal frequency and a cutoff operating condition at said idler signal frequency to suppress said upper sideband signal and said idler signal respectively from entering said waveguide means and
   an approximate one-quarter wavelength operating condition at the pump signal frequency to provide efficient coupling of said diode at the pump signal frequency to said waveguide means.

2. A parametric amplifier comprising:
   a diode,
   an input signal source coupled to said diode for providing an input signal,
   a pump signal source coupled to said diode for providing a pump signal,
   said diode amplifying said input signal through interaction of said input signal and said pump signal and generating thereby an upper sideband signal and an idler signal,
   transmission line means for coupling said input signal to said diode,
   said transmission line means having an upper sideband signal frequency suppression means to inhibit upper sideband signals in said transmission line means,
   said transmission line having a pump signal frequency suppression means to inhibit pump signals in said transmission line means,
   said transmission line means having an idler signal frequency suppression means to inhibit idler signals in said transmission line means, and
   said upper sideband suppression means, pump signal suppression means, and idler signal suppression means being situated on said transmission line at predetermined spacings and distances from said diode to provide minimum interaction of said upper sideband, pump, and idler signal frequencies with said input signal frequency.

3. The parametric amplifier of claim 1 wherein said diode has a predetermined case capacitance, said diode having an impedance substantially matched to said pump signal source impedance by the combination of increasing the diode input impedance by locating said diode in a predetermined geometric position in said waveguide means and by an impedance transformation means at a step junction in said waveguide means,
   transmission line means for coupling said input signal to said diode,
   said transmission line means having an upper sideband signal frequency suppression means to inhibit the upper sideband signal in said transmission line means wherein the upper sideband signal suppression means includes a radial choke of predetermined dimensions and impedance and separated by a section of transmission line of predetermined impedance from said diode whereby the combined impedance of said radial choke and said transmission line section act in series with the coupling inductance located at the junction of the terminating waveguide and waveguide means to substantially resonate with the diode case capacitance for inhibiting the flow of upper sideband signal current in said diode,
   said transmission line means having a pump signal frequency suppression means to inhibit pump signals in said transmission line means,
   said transmission line means having an idler signal frequency suppression means to inhibit said idler signals in said transmission line means, and
   said upper sideband suppression means, pump signal suppression means, and idler signal suppression means situated along said transmission line at predetermined spacings and distances from said diode to provide minimum interaction of said upper sideband, pump, and idler frequencies with said input signal frequency.

4. The parametric amplifier of claim 1 wherein the diode impedance is substantially matched to the pump signal source impedance by the combination of increasing said diode input impedance by locating said diode in a predetermined geometric position at a junction of said terminating waveguide and said waveguide means and by an impedance transformation means at a step junction in said waveguide means.

5. A parametric amplifier comprising:
a diode,
an input signal source coupled to said diode for providing an input signal,
a pump signal source coupled to said diode for providing a pump signal,
said diode amplifying said input signal through interaction of said input signal and said pump signal and generating thereby an upper sideband signal and an idler signal,
waveguide means coupled to said pump signal source and said diode,
means for coupling said diode to a junction of a matching waveguide and a terminating waveguide of said waveguide means, said junction having a predetermined coupling inductance, said terminating waveguide having predetermined dimensions to provide a one-half wavelength operating condition at the upper sideband signal frequency and a cutoff operating condition at said idler signal frequency to substantially inhibit said upper sideband signal and said idler signal respectively from entering said matching waveguide and said pump signal source, and an approximate one-quarter wavelength operating condition at the pump signal frequency to provide efficient coupling of the diode at the pump frequency to said matching waveguide and to said pump signal source,
transmission line means for coupling an input signal to said diode from a signal circulator,
said diode having a predetermined case capacitance, and
said transmission line means having an upper sideband signal frequency suppression means to inhibit upper sideband signals from entering said signal circulator and wherein said upper sideband signal suppression means is a radial choke of predetermined dimensions and impedance and separated by a section of transmission line of predetermined impedance from said diode whereby the combined impedances of the radial choke and said transmission line section act in series with the waveguide coupling inductance to substantially resonate with the diode case capacitance for inhibiting the flow of upper sideband signal current in said diode.

6. The parametric amplifier as claimed in claim 1 wherein said waveguide means is of predetermined dimensions to substantially match the impedance of said diode to the impedance of the pump source at said impedance transformation means.

7. The parametric amplifier as claimed in claim 1 wherein said waveguide means is of predetermined dimensions to substantially match the impedance of the pump signal source to the impedance of said diode at said impedance transformation means and to inhibit the idler signals from entering said pump signal source.

8. The parametric amplifier as claimed in claim 1 wherein said waveguide means includes a matching waveguide coupled to said diode and an idler isolation waveguide and wherein said impedance transformation means at the step junction of said matching waveguide and said idler isolation waveguide has the height of the matching waveguide substantially lower than the height of the idler isolation waveguide by a predetermined ratio.

9. The parametric amplifier as claimed in claim 1 wherein said diode is a varactor diode.

* * * * *